US006201208B1

(12) United States Patent
Wendt et al.

(10) Patent No.: US 6,201,208 B1
(45) Date of Patent: Mar. 13, 2001

(54) METHOD AND APPARATUS FOR PLASMA PROCESSING WITH CONTROL OF ION ENERGY DISTRIBUTION AT THE SUBSTRATES

(75) Inventors: Amy Eileen Wendt; Shiang-Bau Wang, both of Madison, WI (US)

(73) Assignee: Wisconsin Alumni Research Foundation, Madison, WI (US)

(*) Notice: Subject to any disclaimer, the term of this patent is extended or adjusted under 35 U.S.C. 154(b) by 0 days.

(21) Appl. No.: 09/433,461

(22) Filed: Nov. 4, 1999

(51) Int. Cl.$^7$ ..................................................... B23K 9/00
(52) U.S. Cl. ................ 219/121.41; 156/345; 219/121.43
(58) Field of Search ........................ 219/121.41, 121.43, 219/121.54; 361/234, 253; 156/345; 204/198.35, 298.11, 298.39, 192.3, 192.12; 118/723 I

(56) References Cited

U.S. PATENT DOCUMENTS

| | | |
|---|---|---|
| 4,622,094 | 11/1986 | Otsubo . |
| 5,501,893 | 3/1996 | Laermer et al. . |
| 5,847,918 * | 12/1998 | Shuffebotham et al. ............ 361/234 |
| 5,891,349 * | 4/1999 | Tobe et al. .............................. 216/68 |
| 6,023,038 * | 2/2000 | van Gogh ....................... 219/121.43 |
| 6,129,806 * | 10/2000 | Kaji et al. ............................. 156/345 |

OTHER PUBLICATIONS

Nobuo Fujiwara, et al., "Pulsed Plasma Processing for Reduction of Profile Distortion Induced by Charge Buildup in Electron Cyclotron Resonance Plasma," Jpn. J. Appl. Phys. vol. 35 (1996), pp. 2450–2455.

Seiji Samukawa, et al., "Pulse– Time Modulated Electron Cyclotron Resonance Plasma Etching for Highly Selective, Highly Anisotropic and Less–Charging Polycrystalline Silicon Patterning," J. Vac. Sci. Technol. B 12(6), Nov./Dec. 1994, pp. 3300–3305.

Gyeong S. Hwang, et al., "On the Link Between Electron Shadowing and Charging Damage," J. Vac. Sci. Technol. B 15(5), Sep./Oct. 1997, pp. 1839–1842.

Gyeong S. Hwang, et al., "Electron Irradiance of Conductive Sidewalls: A Determining Factor for Pattern–Dependent Charging," J. Vac. Sci. Technol. B 15(5), Sep./Oct. 1997, pp. 1741–1746.

(List continued on next page.)

*Primary Examiner*—Teresa Walberg
*Assistant Examiner*—Quang Van
(74) *Attorney, Agent, or Firm*—Foley & Lardner

(57) ABSTRACT

In plasma processing, a bias voltage is provided from a power supply through a DC blocking capacitor to a platform on which a substrate to be treated is supported within a plasma reactor. The periodic bias voltage applied to the DC blocking capacitor has a waveform comprised of a voltage pulse peak followed by a ramp down of voltage from a first level lower than the pulse peak to a second lower level, the period of the bias waveform and the ramp down of voltage in each cycle selected to compensate for and substantially cancel the effect of ion accumulation on the substrate so as to maintain a substantially constant DC self-bias voltage on the substrate between the voltage pulse peaks. The waveform may include a single voltage pulse peak followed by a ramp down in voltage during each cycle of the bias voltage such that the ion energy distribution function at the substrate has a single narrow peak centered at a selected ion energy. The waveform may also comprise two voltage pulse peaks each followed by a ramp down of voltage selected to provide a bias voltage at the substrate comprising two voltage peaks during each cycle with DC self-bias voltages following each pulse peak at two different substantially constant DC levels, resulting in an ion energy distribution function at the substrate that includes two peaks of ion flux centered at two selected ion energies with substantially no ion flux at other ion energies. The ion energy distribution function may thus be tailored to best accommodate the desired plasma treatment process and can be used to reduce the effects of differential charging of substrates.

18 Claims, 10 Drawing Sheets

OTHER PUBLICATIONS

Nubuo Fujiwara, et al., "Charge Accumulation Effects on Profile Distortion in ECR Plasma Etching," Plasma Sources Sci. Technol. 5 (1996), pp. 126–131.

Toshikazu Shibayama, et al., "Silicon Etching by Alternating Irradiations of Negative and Positive Ions," Plasma Sources Sci. Techol. 5 (1996), pp. 254–259.

Seiji Samukawa, "Pulse–Time–Modulated Electron Cycoltron Resonance Plasma Etching for Highly Selective, Highly Anisotropic and Notch–Free Polycrystalline Silicon Patterning," Appl. Phys. Lett. 64 (25), Jun. 20, 1994, pp. 3398–3400.

Hiroto Ohtake, et al., "Charge–Free Etching Process Using Positive and Negative Ions in Pulse– Time Modulated Electron Cyclotron Resonance Plasonance Plasma with Low–Frequency Bias," Appl. Phys. Lett. 68 (17), Apr. 22, 1996, pp. 2416–2417.

Seiji Samukawa, et al., "Time–Modulated Electron Cyclotron Resonance Plasma Discharge for Controlling Generation of Reactive Species," Appl. Phys. Lett. 63 (15), Oct. 11, 1993, pp. 2044–2046.

Tae Hyuk Ahn, et al., "A New Technology for Negative Ion Detection and the Rapid Electron Cooling in a Pulsed High–Density Etching Plasma," Jpn. J. Appl. Phys. vol. 34 (1995) Pt. 2, No. 10B, Oct. 15, 1995, pp. 1405–1408.

Nobuo Fujiwara, et al., "Profile Control of Poly–Si Etching in Electron Cyclotron Resonance Plasma," Jpn. J. Appl. Phys., vol. 34 (1995), Pt. 1, No. 4B, Apr. 1995, pp. 2095–2100.

Toshihisa Nozawa, et al., "The Electron Charging Effects of Plasma on Notch Profile Defects," Jpn. J. Appl. Phys., vol. 34 (1995), Pt. 1, No. 4B, Apr. 1995, pp. 2107–2113.

Jay Sasserath, et al. "DRIE Profile Control Holds Promise for Varied Applications," Micromachine Devices, vol. 2, No. 11, Nov. 1997, pp. 1, 4.

Michael K. Harper, "Synchronous Substrate/Plasma Pulsing for the Reduction of Differential Charging," Ph. D. Thesis, University of Wisconsin–Madison, 1998.

Gyeong S. Hwang, et al., "On the Origin of the Notching Effect During Etching in Uniform High Density Plasmas," J. Va. Sci. Technol. B 15(1), Jan./Feb. 1997, pp. 70–87.

* cited by examiner

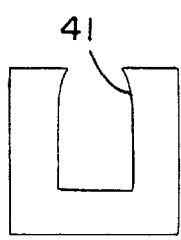
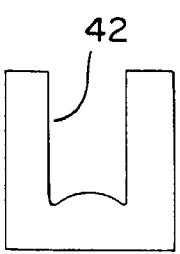
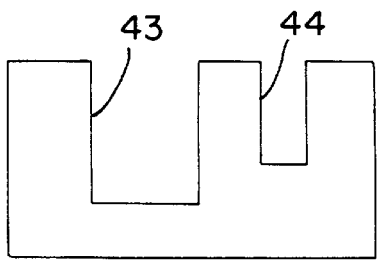
FIG. 2        FIG. 3        FIG. 4
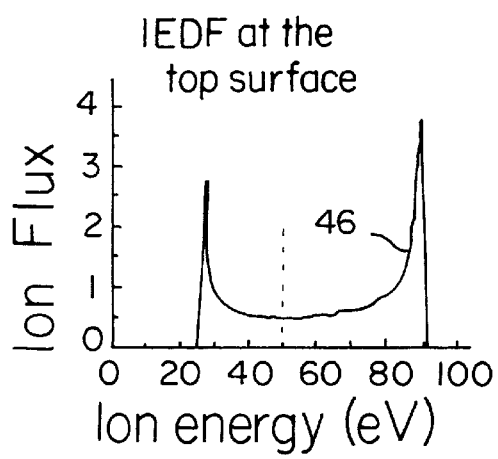
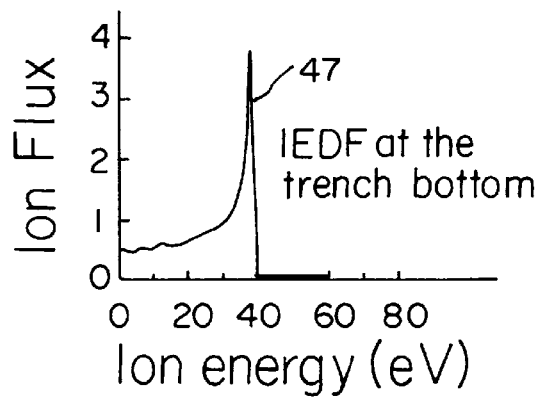
FIG. 5        FIG. 6
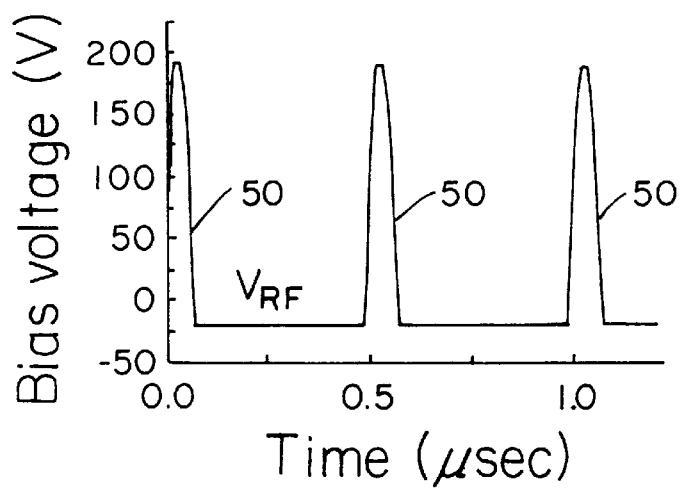
FIG. 7

Power Amplifier
Input Signal

Power Amplifier
Output ($V_{RF}$)

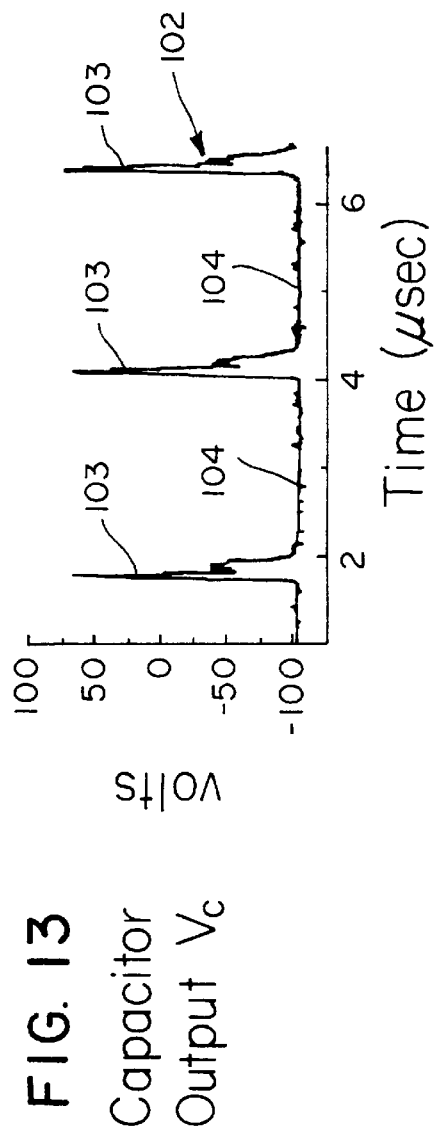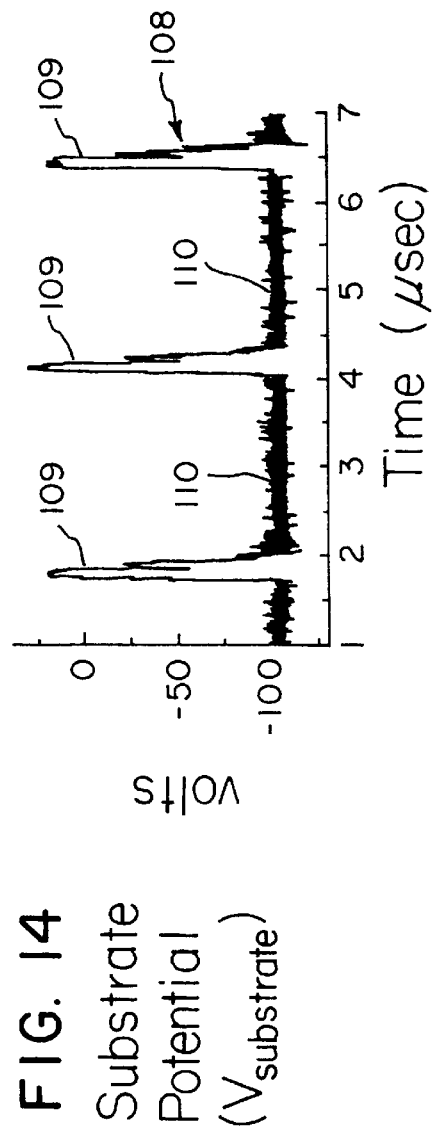
FIG. 13 Capacitor Output $V_c$
FIG. 14 Substrate Potential ($V_{substrate}$)

METHOD AND APPARATUS FOR PLASMA PROCESSING WITH CONTROL OF ION ENERGY DISTRIBUTION AT THE SUBSTRATES

This invention was made with United States government support awarded by the following agency: NSF Grant No: 8721545. The United States has certain rights in this invention.

FIELD OF THE INVENTION

This invention pertains generally to the field of semiconductor manufacturing and particularly to plasma processing of substrates such as semiconductors.

BACKGROUND OF THE INVENTION

A particular advantage of plasma-assisted etching of materials over wet etching processes is the directionality of the plasma-assisted etching due to energetic ion bombardment of the substrate. Plasma etching is indispensable in semiconductor manufacturing for reducing device size and increasing the aspect ratio of etched features. The energy provided to the substrate surface from ion impact can enhance chemical reactions via several mechanisms, demonstrated both in simulations and ion beam experiments, with significant advantages in controlling the profile of etched features, in etch selectivity, and in film quality in plasma enhanced chemical vapor deposition processes (PECVD). In typical plasma processes used in semiconductor manufacturing, the ion energy is coarsely controlled by varying the amplitude of a radio frequency (RF) sinusoidal bias voltage that is applied to the substrate electrode. However, the resulting energy distribution function (IEDF) is generally broad, which limits the ability of the plasma process to further improve such characteristic as etch feature profiles, etch selectivity and PECVD film quality.

The use of the conventional sinusoidal substrate bias for IEDF control is limited by physical constraints. The ion mean-free path in the sheath region, the ion sheath transit time, and the substrate bias voltage waveform, which determines the sheath voltage drop between the plasma and the substrate, are the primary factors that determine the IEDF at the substrate. In the high pressure and/or high substrate voltage conditions typically used in reactive ion etching (RIE), the mean-free path of ions is comparable to or even shorter than the sheath thickness. In such cases, the IEDF at the substrate is broadened due to the collision in the sheath region regardless of the bias voltage waveform. In contrast, high density plasmas (HDP) used for semiconductor processing, characterized by high plasma density, low pressure and lower average substrate voltage, typically have collisionless sheaths at the substrate. The typical IEDF at the substrate for a HDP process is a bimodal curve which coalesces into a single peak when the substrate bias frequency is sufficiently high as compared to the ion plasma frequency. The variation in ion energy arises from the temporal modulation of the sheath voltage. If the ion transit time across the sheath is short compared to the RF period, the bombarding energy of any given ion will correspond to the sheath voltage at the moment it reaches the sheath edge. For ion transit time long compared to the RF period, the ion energy more closely corresponds to the average sheath voltage. Although increasing the bias frequency is one route that has been considered as a method for narrowing the IEDF, it suffers from two fatal limitations. First, the width of the IEDF is ion mass dependent, and, even for low bias frequencies, tends to be wide for low mass ions that are often produced in processing plasmas. Second, at sufficiently high frequencies, the RF wavelength becomes comparable to the substrate dimensions, and bias voltage non-uniformities across the substrate surface develop, leading to unacceptable process non-uniformities.

As discussed above, the IEDF for the conventional RF sinusoidal bias voltage waveform is a broad bimodal (double peaked) curve. To increase etching selectivity, it would be desirable to narrow the IEDF. The U.S. patent to Otsubo, U.S. Pat. No. 4,622,094, describes the use of a shaped bias voltage directly coupled to the electrode on which the workpiece or substrate is mounted to reduce the IEDF to a single peak rather than a double peak. However, it would be desirable to further reduce the width of the IEDF function to enhance selectivity and to be able to selectively control the ion peak energy and the ion current. Further, for the etching of high aspect ratio trenches (the ratio of depth to width of the trench) the differential charging effect becomes significant and modifies the IEDF at the bottom of the trench from that at the workpiece surface.

Differential charging occurs in the etching of dielectric materials or materials with a dielectric sub-layer. The electrons in the plasma have a much higher temperature than the ions and arrive at the surface of the substrate with a nearly isotropic distribution. A large fraction of the electrons thus will strike the top or upper portions of the sidewalls of the deep trench in a dielectric material (such as a photoresist), charging these surfaces negatively. The ions are anisotropic and arrive at the surface almost completely normal to the surface as a result of the potential drop across the sheath. The ions move directly down the trench and collect at the bottoms of the trenches, which charge positively. The negatively charged trench sidewalls may even further limit electrons from reaching the trench bottom. As a consequence, the trench bottom is charged to a potential such that relatively lower energy ions will be deflected and may strike and etch the sidewalls, consequently inducing profile defects. Even the higher energy ions are decelerated by the positive potential at the trench bottom, and consequently the etching rate at the trench bottom is lowered, and can even be stopped.

For a broad bimodal IEDF, which is induced by a sinusoidal bias voltage waveform, the potential at the trench bottom is located between the two peaks in the IEDF. For an IEDF having a single peak, the trench bottom potential will be within the relatively narrow range of the ion energy peak. If two plasma processes are carried out with the same average ion energy, but one with a broad IEDF and the other with a narrow IEDF, the deflected ions for the narrow IEDF process will carry higher energy than the deflected ions in the broad IEDF process, and, consequently, the ions striking the trench bottom surface for the narrow IEDF process carry lower energy than the ions striking the trench bottom in a broad IEDF process. As a result, a single peaked IEDF may induce more severe profile defects and ultimately a slower etching rate for deep etching. In addition, in some cases a narrow peak IEDF may induce higher trench bottom potentials which will increase the tunneling current flowing through a thin gate oxide, potentially damaging the oxide.

SUMMARY OF THE INVENTION

In accordance with the invention, pulse biasing of the substrate being treated is carried out by tailoring the IEDF to a peak or peaks of relatively narrow energy range centered at selected ion energies, with minimum ion flux at ion energies other than the selected ion energy peak or peaks. The substrate may be biased to have an IEDF with a single ion flux peak centered at a particular ion energy selected to provide desired etching characteristics for a particular process. Both the magnitude of the ion flux peak and the ion energy at which the peak is centered may be selected as desired for a particular application, and may be changed during processing to accommodate different requirements at different stages of the processing. Furthermore, the invention may be carried out to provide two ion flux peaks centered at two ion energies, with substantially no ion flux at energies beyond the regions of the peaks. The ion energies at which the peaks are centered and the magnitude of the ion flux at each peak may be adjusted to achieve process conditions. For example, the lower energy peak may be positioned to provide ions that are sufficiently low in energy as to be deflected to the top and sidewalls of trench structures to neutralize the electrons accumulated on these structures without reaching the bottom of the trench or etching the sidewalls, while the ion flux peak centered at a higher ion energy may provide ions of energy sufficiently high that they will pass directly to the bottom of trenches without deflection to efficiently carry out etching at the trench bottoms.

In accordance with the invention, a bias power supply, which may comprise a signal generator coupled to a power amplifier, provides a bias voltage to a DC blocking capacitor which is electrically connected to the platform electrode or stage to which the substrate (workpiece) is mounted in electrical contact therewith. The waveform of the bias voltage from the bias power supply has a cycle which includes a pulse peak followed by a ramp down of voltage from a first level, lower than the pulse peak, to a second lower voltage level. The period of the bias waveform applied to the DC blocking capacitor and the ramp down of voltage in each cycle are selected to compensate for and substantially cancel the effect of ion accumulation on the workpiece so as to maintain a substantially constant DC self-bias voltage on the workpiece between the voltage pulse peaks. The waveform of the bias voltage at the substrate has a cycle comprised of a narrow pulse of voltage, during which electrons are attracted from the plasma to the substrate, followed by a substantially constant DC bias voltage level resulting from a self-bias of the substrate maintained by the DC blocking capacitor. Where there is a single narrow voltage pulse peak followed by a ramp down in voltage during each cycle of the bias voltage, the ion energy distribution function for ions at the surface of the workpiece has a single narrow peak centered at a selected ion energy. Each cycle of the bias voltage applied to the DC blocking capacitor may comprise two narrow voltage pulse peaks each followed by a ramp down of voltage, with the separation in time between the voltage pulse peaks, the heights of the voltage pulse peaks, and the ramp down of voltage between pulse peaks selected to provide a bias voltage at the substrate comprising two voltage pulses during each cycle with DC self-bias voltages following each pulse which are two different substantially constant DC levels, thereby providing an ion energy distribution function at the substrate that includes two peaks of ion flux centered at two selected ion energies with substantially no ion flux at other ion energies.

Because the DC blocking capacitor allows the voltage at the output of the capacitor to be directly related to the voltage at the substrate, this capacitor output voltage may be monitored to indirectly monitor the actual voltage at the substrate without requiring the use of a probe within the plasma reactor to directly monitor the substrate potential. The voltage at the output of the capacitor may then be used in a feedback loop to control the waveform of the output of the bias power supply to maintain the self-bias DC voltage level (or levels) between pulse peaks substantially constant and at a desired potential. Further, the voltage across the DC blocking capacitor may be monitored, and the slope of the voltage across the capacitor between pulse peaks determined, to obtain an estimate of ion flux. This information may then be used in a feedback loop to control the excitation of the plasma to achieve a desired level of ion flux.

Further objects, features and advantages of the invention will be apparent from the following detailed description when taken in conjunction with the accompanying drawings.

BRIEF DESCRIPTION OF THE DRAWINGS

In the drawings:

FIG. 2 is an illustrative diagram showing bowing in trenches formed as a result of differential charging.

FIG. 3 is an illustrative diagram showing the potential for double trenching at the bottom of trenches that may occur as a result of differential charging.

FIG. 4 is an illustrative diagram showing the potential for reactive ion etching lag between wide and narrow areas being etched.

FIG. 5 is a diagram illustrating the IEDF at the top surface of a workpiece with a conventional RF sinusoidal bias applied.

FIG. 6 is a diagram of the IEDF at the bottom of a trench in the workpiece with application of a conventional RF sinusoidal bias.

FIG. 7 is a waveform provided for purposes of illustrating the principles of the invention comprising separated pulse peaks.

FIG. 13 is an illustrative waveform of the voltage at the output of the DC blocking capacitor connected to the substrate with a bias voltage having the waveform of FIG. 12 applied thereto.

FIG. 14 is an illustrative waveform of the potential measured at the substrate with a bias voltage having the waveform at the output of the blocking capacitor as illustrated in FIG. 13.

DETAILED DESCRIPTION OF THE INVENTION

Figure 1:
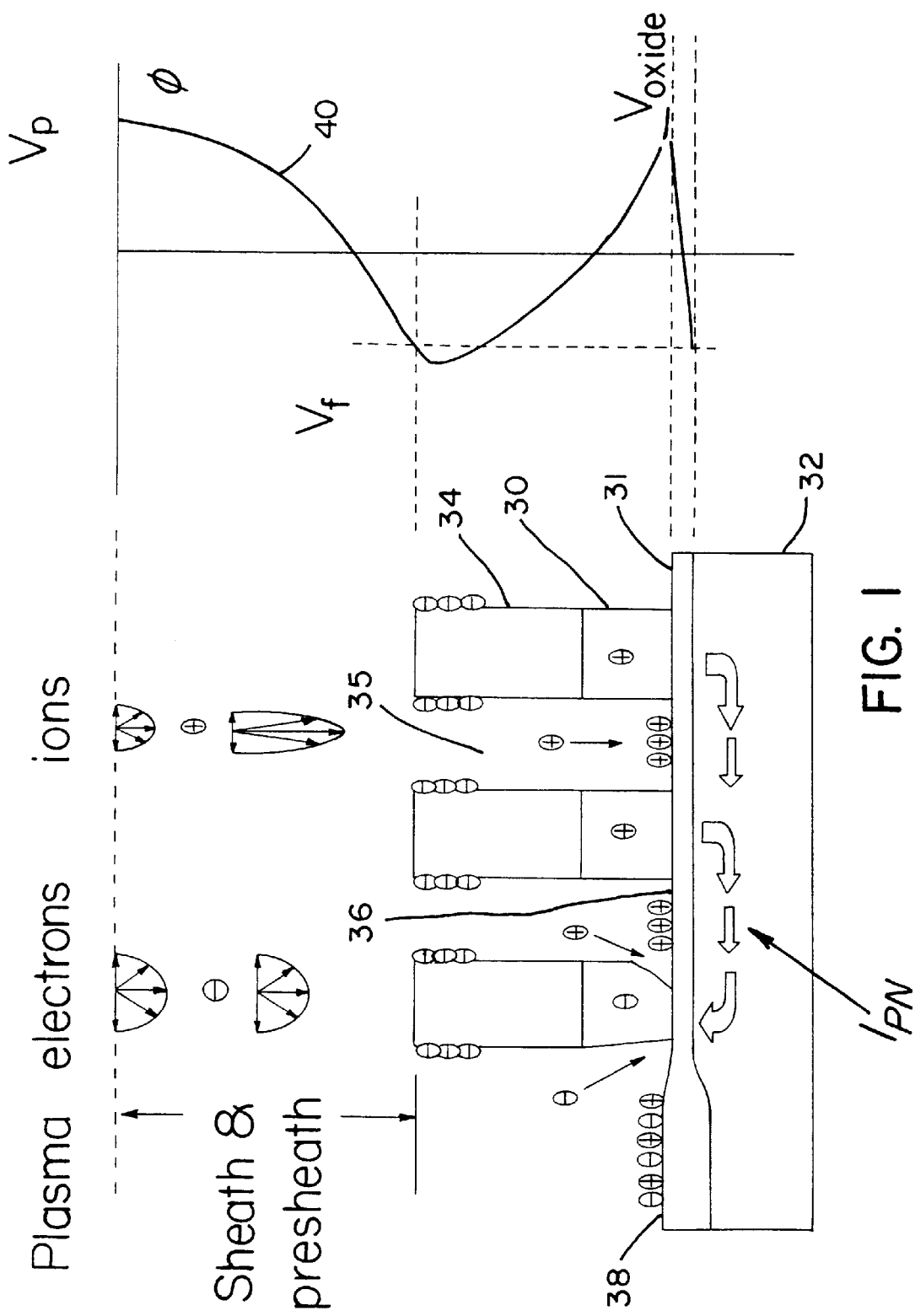
FIG. 1 is a schematic view illustrating the collection of charge on structures during conventional reactive ion etching processes and the potential notching and tunneling current damage due to differential charging.

With reference to the drawings, the causes and effects of differential charging that occurs during conventional plasma etching are illustrated in FIGS. 1–4. For purposes of illustration, a substrate or workpiece is shown in FIG. 1 comprised of a thin layer of polysilicon 30 applied over a gate layer of silicon dioxide 31 on a single crystal silicon wafer 32. The film 30 is covered by a layer of photoresist 34 which is patterned in a conventional manner to leave open areas 35 which, during the initial etching process, etch through the polysilicon film 30 to expose surfaces 36 of the layer 31. In FIG. 1, the electrons are indicated by the circles with a "−" in them while the ions are indicated by the circles with a "+" sign. The electrostatic forces on the ions and electrons are schematically illustrated for the main plasma region and for the plasma sheath and pre-sheath. The electrons arrive at the surfaces of the resist 34 and the etchable film 30 with nearly an isotropic distribution, permitting a large fraction of them to strike the upper sidewalls of the resist. More electrons accumulate on the sidewalls of the resist than ions, charging the sidewalls negatively. The ions reach the surfaces of the resist and the etchable film almost completely normal to these surfaces because of the accelerating potential drop across the sheath. The result is that a large flux of ions is directed to the exposed bottom areas 36 (including the exposed polysilicon film 30 before it has been etched away to the point illustrated in FIG. 1). These bottom surfaces become positively charged. The materials of the resist 34 (as well as many of the etchable film materials such as undoped polysilicon or silicon dioxide) are dielectrics, so that the differential charging of these structures is substantially maintained. The differential charging will build an electric field strong enough to distort the trajectory of the ions and electrons. Ions are deflected toward the sidewalls and strike and etch away these walls. The ions can be sufficiently deflected to etch into the bottom of the vertical structures, particularly the outermost of a series of line type structures to form a notch as illustrated in FIG. 1. The layer of silicon dioxide material 31 may be intended to function as an FET gate structure over a single crystal silicon substrate 32, and a field oxide 38 may also be formed on the substrate. The charging of the gate oxide layer 31 can drive tunneling currents that damage the thin oxide layer 31.

The potential at the various regions is illustrated by the graph labeled 40 in FIG. 1. As illustrated therein, the potential is substantially different at the top surface of the resist 34 than at the bottom 36 of the trenches. The ion trajectory (or ion energy) is strongly related to the etching profile. The types of undesired effects that can result from lack of control over the etching profile are illustrated in FIG. 2, showing a trench 41 with bowing, in FIG. 3, showing a trench 42 having a double trenched bottom, and in FIG. 4 showing the results of reactive ion etching (RIE) of a wide trench 43 and a narrow trench 44 in which the etching proceeds more rapidly in the wide openings than in the narrow openings.

In conventional plasma etching processes, an RF bias is applied through a matching network to the platform electrode on which the substrate (workpiece) is mounted. This results in a double peaked IEDF, as illustrated by the graph 46 in FIG. 5, at the top surface of the workpiece being etched. However, at the bottom surfaces of the trenches, the IEDF has the form illustrated by the graph 47 shown in FIG. 6. The sinusoidal bias voltage is applied through a matching network that includes a blocking capacitor and other elements so that a DC self-bias is developed on the support platform and on the substrate of the workpiece. The conventional RF sine wave bias is typically applied at 13.56 MHz. A DC self bias of the semiconductor wafer is generally necessary or desired to allow etch rates suitable for manufacturing purposes and to obtain acceptable etch anisotropies. The IEDF for the sinusoidal bias thus covers a broad range of ion energies, as illustrated for the top and bottom surfaces of the workpiece in FIGS. 5 and 6, respectively, with a non-zero ion flux between the two peaks in the IEDF at the top surface and from the single peak down to zero ion energy in the IEDF at the bottoms of the trenches. This spread of ion energies in the ion flux contributes to the etching problems discussed above, and this type of bias does not allow the type of precise selection of ion energies that would be desirable for many applications.

Figure 8:
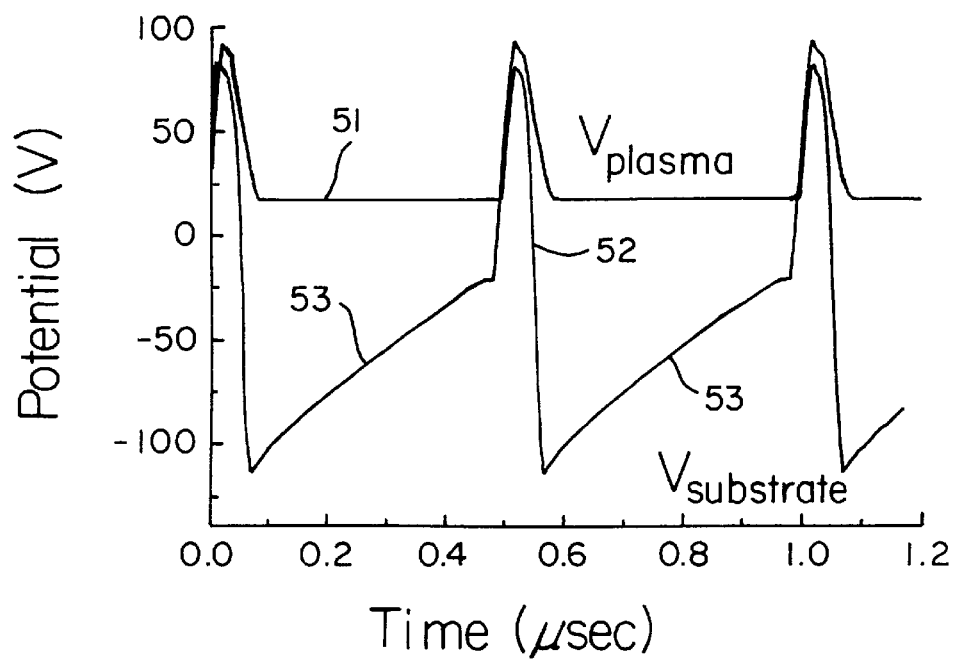
FIG. 8 are illustrative waveforms of the potentials in the plasma and at the substrate where a bias voltage as illustrated in FIG. 7 is applied through a DC blocking capacitor.
Figure 9:
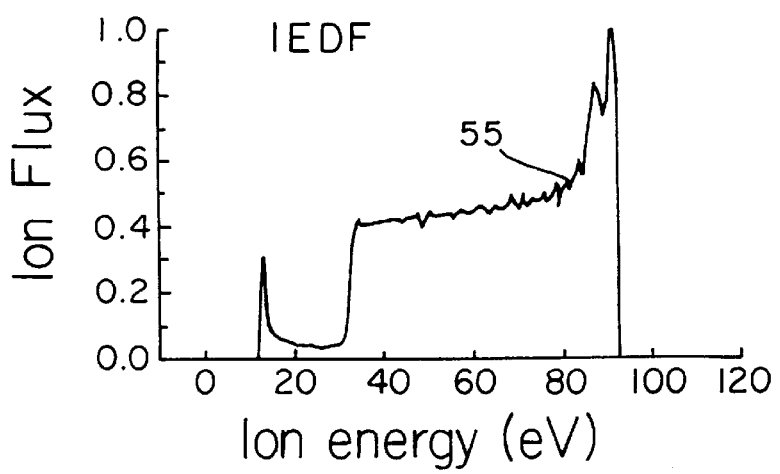
FIG. 9 is a diagram illustrating the IEDF for the bias voltage waveform of FIG. 7.

The present invention carries out a pulsed biasing of the substrate being treated in a manner which allows tailoring of the IEDF to one or more ion energies in a peak or peaks of relatively narrow ion energy range centered at selected ion energies, with minimal ion flux at ion energies other than the selected ion energy peak or peaks. To aid in an understanding the principles of the present invention, a bias waveform composed of narrow pulses 50 separated by off times may be considered as shown in the waveform in FIG. 7. The potential of the plasma for such a bias waveform is illustrated by the waveform 51 in FIG. 8, and the waveform of the substrate potential is illustrated at 52 in FIG. 8. It is seen that the substrate potential gradually increases in the segments 53 of the waveform 52 between pulses due to ion bombardment. The resulting IEDF for the pulsed bias of FIG. 7 is shown at 55 in FIG. 9. It is seen that the ion flux again has a broad range of ion energies, with one peak at the high end of the range and a smaller separate peak at the low end of the range. As illustrated in the waveforms of FIG. 8, the substrate potential is always more negative than the plasma potential except during the pulses 50, so that electrons reach the substrate only during the pulses. The exemplary waveforms of FIGS. 7 and 8 (simulations for a 3 mTorr argon plasma, plasma density=$10^{11}$ cm$^{-3}$, Te=3 eV) illustrate that because of the ramp-up of substrate potential in the region 53 between pulses, the IEDF 55 of FIG. 9 has a broad range of ion energies.

In the present invention, the pulse waveform is tailored and applied to the substrate in such a way as to compensate for the ramp-up of substrate potential and thereby essentially eliminate ion flux at ion energies other than a selected narrow peak range, or peak ranges, to allow selection of the ion energy value at a peak or peaks, and to select and control the ion flux at the peak (or peaks).

Figure 10:
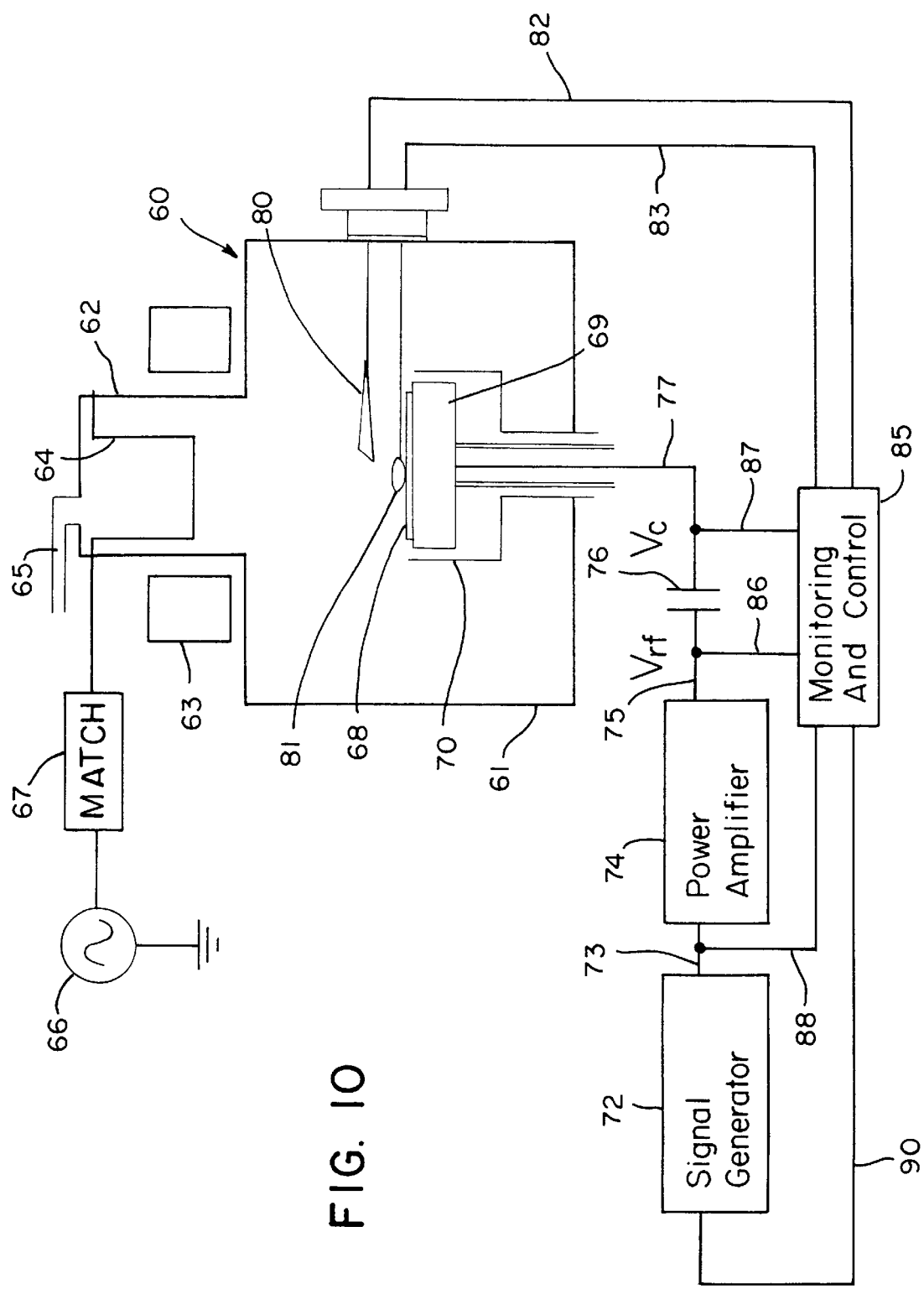
FIG. 10 is a schematic diagram of plasma processing apparatus for carrying out the present invention.
Figure 11:
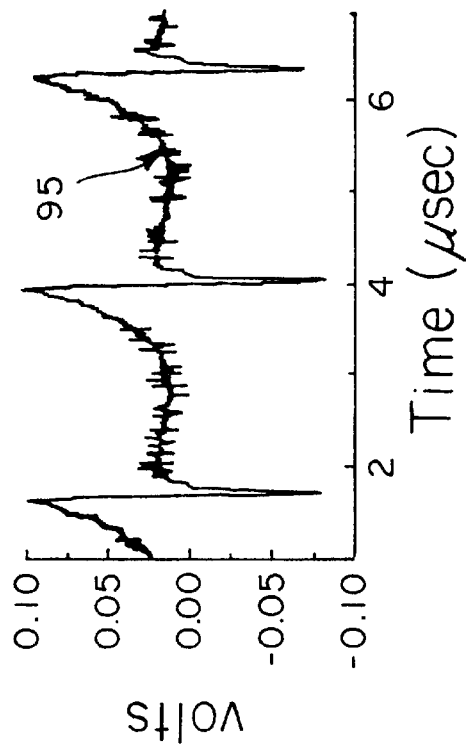
FIG. 11 is an illustrative waveform provided by a signal generator portion of the bias power supply that may be utilized in the present invention.

An exemplary plasma processing reactor for carrying out the present invention is shown generally at 60 in FIG. 10. The reactor 60 may be of substantially conventional construction, including a vacuum enclosure 61 which is evacuated by a pump or pumps (not shown). For exemplification only, the plasma excitation in the reactor 60 is by a helicon type plasma source 62 which has a magnetic coil 63, an antenna 64, and a gas inlet 65 for introduction of the gas in the vacuum chamber 61 in which the plasma is to be excited. RF power is provided from an RF power supply 66 (e.g., at 13.56 MHz) through a matching network 67 to the antenna 64. It should be understood that the present invention is not limited to helicon-type reactors, and any other type of plasma reactor may be utilized with other types of plasma excitation, including capacitively and inductively coupled excitation, electron cyclotron resonance excitation, etc. The substrate 68 to be treated (e.g., a semiconductor wafer), is supported on a support platform or electrode 69 which may comprise a portion of a conventional wafer chuck 70 for semiconductor wafer processing. The platform may be conductive and the substrate 68 is then in electrical contact with the platform 69 as well as capacitively coupled thereto so that the workpiece will be at the same potential as the platform. The platform 69 may also be formed to have an insulating layer between the platform and the substrate with the substrate being capacitively coupled to the platforms but may float at a different voltage than the platform. A signal generator 72 provides a selected waveform on a line 73 to a power amplifier 74 which provides an output bias voltage on a line 75 to a DC blocking capacitor 76. The signal generator 72 and the power amplifier 74 together comprise a bias power supply and may be combined together in one unit if desired. The blocking capacitor is electrically connected by a line 77 to the platform electrode 69. In the present invention, conventional matching networks are preferably not used, with coupling of the bias drive power to the platform and to the substrate held thereon preferably solely through the blocking capacitor 76. The use of only the blocking capacitor 76 to couple the bias power to the platform rather than a conventional matching network facilitates the application of the desired bias waveform to the platform and to the workpiece.

Although not needed for the present invention as explained further below, for purposes of monitoring conditions within the reactor 61 an emissive probe 80 mounted within the plasma region and an electric probe 81 mounted to the wafer may be used to monitor directly the plasma potential and the potential at the surface of the substrate. These probes are connected by lines 82 and 83, respectively, to a monitoring and control circuit 85. The monitoring and control circuit 85 also preferably is connected by lines 86 and 87 to the input side and output side, respectively, of the blocking capacitor 76 to enable monitoring of the voltage across the blocking capacitor and the voltage at the platform 69. The monitoring and control circuit 85 also preferably receives a signal on a line 88 to monitor the voltage on the line 73 at the output of the signal generator, and may provide an output control signal on a line 90 back to the signal generator 72 to control the waveform produced by the signal generator in a feedback control scheme, as discussed further below. The use of the reactor 60 to provide tailored biasing of the substrate will now be described.

Figure 15:
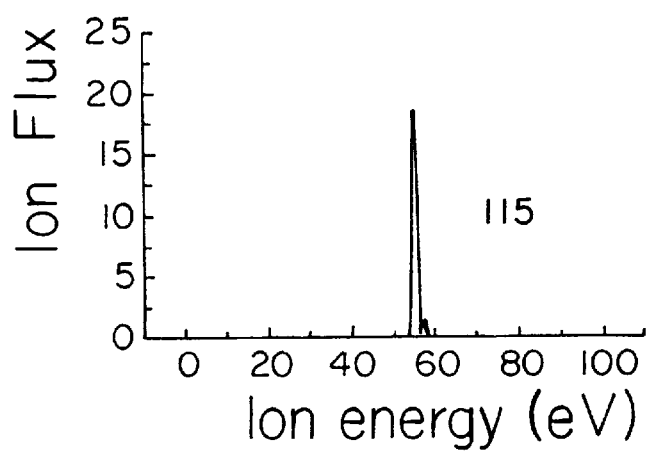
FIG. 15 is a diagram showing the IEDF obtained utilizing the bias voltage waveform of FIG. 12.
Figure 16:
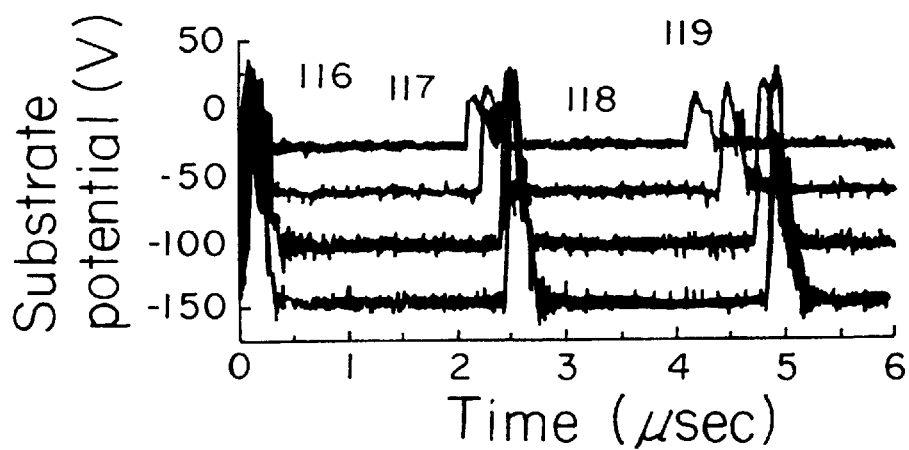
FIG. 16 are diagrams of measured potential at the substrate (corresponding to the diagram of FIG. 14) illustrating the effect of changes in the bias voltage waveform amplitude and frequency.

The signal generator 72 is preferably capable of being programmed to provide an output signal with a periodic waveform of arbitrary selected shape. In the present invention, the signal generator 72 is programmed to apply an output signal on the line 73 that, when amplified by the power amplifier 74, will yield a bias drive signal on the lines 75 which is of the appropriate waveform shape. The appropriate signal provided by the signal generator 72 is determined by the frequency response characteristics of the power amplifier 74. Thus, it is understood that the appropriate waveform provided by the signal generator 72 may differ depending on the frequency response characteristics of the power amplifier being utilized. The signal generator and power amplifier may also be combined into a single programmable power supply which provides the appropriate output waveform. For purposes only of illustrating the present invention, the output of the signal generator 72 which is provided as the input to the power amplifier 74 may have the exemplary shape shown at 95 in FIG. 11, resulting in an output bias drive signal from the power amplifier as illustrated by the waveform 96 of FIG. 12. Each cycle of the waveform 96 is composed of a narrow voltage pulse peak 97 followed by a section 98 which ramps down in voltage from a point 99 (well below the level of the peak of the pulse) at the end of the pulse 97 to a lower voltage point 100, at which a new cycle begins with application of the voltage pulse peak 97. In the present invention, a preferred repetition frequency for the pulse bias waveform is in the range of 200 kHz to 500 kHz. The output of the power amplifier having the waveform 96 is applied to the blocking capacitor 76, which passes drive power on the line 77 having the waveform 102 shown in FIG. 13, comprised of a large narrow peak pulse 103 at the beginning of each cycle followed by a constant voltage section 104 that continues until the next cycle begins at the next pulse peak 103. The potential at the substrate 68 follows the voltage on the line 77, having the waveform 108 as shown in FIG. 14, composed of a large narrow pulse peak 109 at the beginning of each cycle and a constant voltage section 110 that continues until the next peak 109 at the beginning of the next cycle. The waveforms of FIGS. 13 and 14 are for a conductive platform 69 that is in electrically conductive contact with the substrate, and thus the capacitor output and substrate potential float at the same level. The substrate potential between pulse peaks is maintained constant at a DC level, e.g., −100 volts. The waveform 108 of FIG. 14 is an exemplary waveform measured by the electric probe 81 at the substrate surface. The waveforms shown in FIGS. 11–14 are for an exemplary plasma process in the reactor 60 utilizing a 20 mTorr argon plasma, 1.5 kW, $T_e \approx 3$ eV, $n_i \approx 10^{11}$ cm$^{-3}$, utilizing 1000 watts of 13.56 MHz drive power from the supply 66 to the antenna 64 of the helicon (resulting in 13.56 MHz "noise" in the measured substrate potential in the inter-peak intervals 110 in FIG. 14). The power amplifier 74 (ENI Model # A500, 500 watts max output, freq. range 300 KHz–35 MHz) provides its output to a DC blocking capacitor 76 of capacitance 3.42 nF. The signal generator 72 driving the power amplifier 74 is a Wavetek 100 MHz synthesized arbitrary waveform generator Model # 395. The chamber of the reactor is grounded and made of stainless steel with an inner diameter of 50 cm and a height of 75 cm. The grounded wall area is much greater than the 10 cm diameter substrate electrode 69. The ramp down in voltage in the section 98 in the power amplifier output waveform in FIG. 12 compensates for the increase in substrate (workpiece) potential due to ion bombardment (shown in the section 53 of the waveform of FIG. 8), resulting in the substantially constant substrate potential section 110 in the waveform of FIG. 14. As a consequence, the IEDF for the substrate bias potential waveform of FIG. 14 has the single sharp peak 115 in ion flux centered at a selected ion energy, as illustrated in FIG. 15, and has substantially zero ion flux at other energies outside the narrow range of the selected ion energy peak. The position of the peak and the maximum ion flux magnitude of the peak 115 may be controlled by appropriate adjustment of the bias input signal amplitude and frequency. Such control is illustrated by the waveforms 116–119 of FIG. 16, showing the substrate potential as the bias drive signal is increased in amplitude and frequency. Each of the waveforms 116–119 of FIG. 16 results in an IEDF having a single peak of narrow range but centered at different selected ion energies.

In the present invention, the DC blocking capacitor 76 serves to permit the DC self bias to be developed at the substrate 68 as the bias drive voltage is coupled through the capacitor 76 to the substrate. The waveform cycle components of the present invention, comprised of a pulse peak which is substantially passed directly through the capacitor 76 to the substrate, results in flow of electrons to the substrate only during application of the pulse peak. The controlled ramp down of voltage applied to the capacitor 76 after the pulse peak compensates and cancels out the increase in potential at the substrate that would otherwise occur as ions accumulate on the substrate between the pulse peaks.

Figure 12:
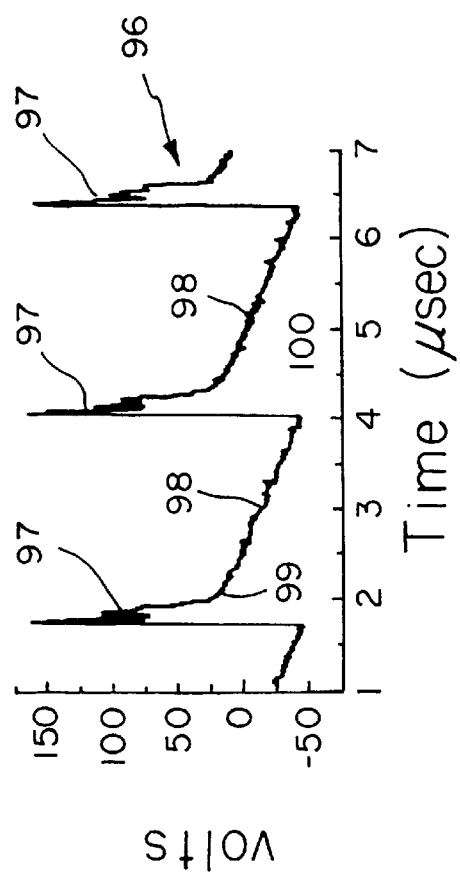
FIG. 12 is an illustrative waveform of the output of the bias power supply in accordance with the invention.

As noted above, the present invention utilizes a blocking capacitor rather than a matching network. Conventional matching networks are designed for impedance matching at a single frequency. Because they employ capacitors and inductors, the impedances of the components in the matching network are frequency dependent. Therefore, if the matching network is tuned for impedance matching at a particular frequency, it will not match effectively at other frequencies. Because the bias voltage waveform of the present invention is non-sinusoidal, it does not contain a single frequency component. The waveform can be represented as a superposition of sinusoidal Fourier components at different frequencies. Because of the multiple frequencies involved, conventional impedance matching by tuning of the matching network is generally not appropriate. The bias voltage waveform of the present invention works effectively without a matching network. Due to impedance mismatch, there is a partial reflection when the pulse reaches the electrode. However, the measured waveforms of FIGS. 12–14 show that this produces only a minor distortion of the pulse shape and does not interfere with implementation of the invention.

Figure 17:
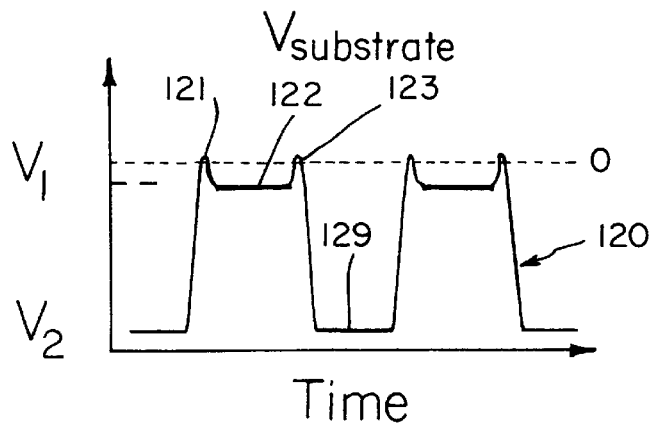
FIG. 17 is an illustrative waveform of a bias voltage applied at the substrate to achieve two separate ion flux peaks at two separate ion energies.
Figure 18:
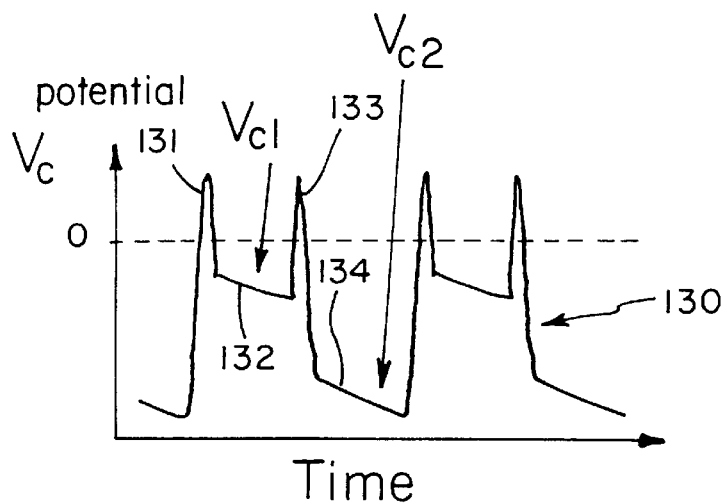
FIG. 18 is an illustrative waveform of the bias voltage at the output of the DC blocking capacitor to provide the potential waveform at the substrate illustrated in FIG. 17.
Figure 19:
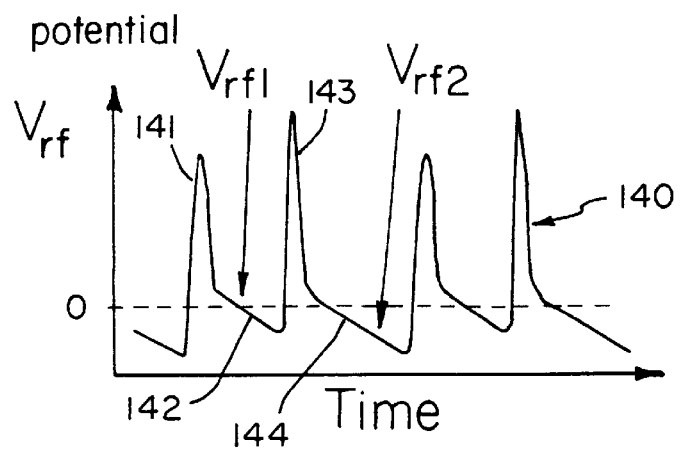
FIG. 19 is an illustrative waveform of the bias voltage provided by the bias power supply to the DC blocking capacitor that results in the substrate bias waveform shown in FIG. 17.
Figure 20:
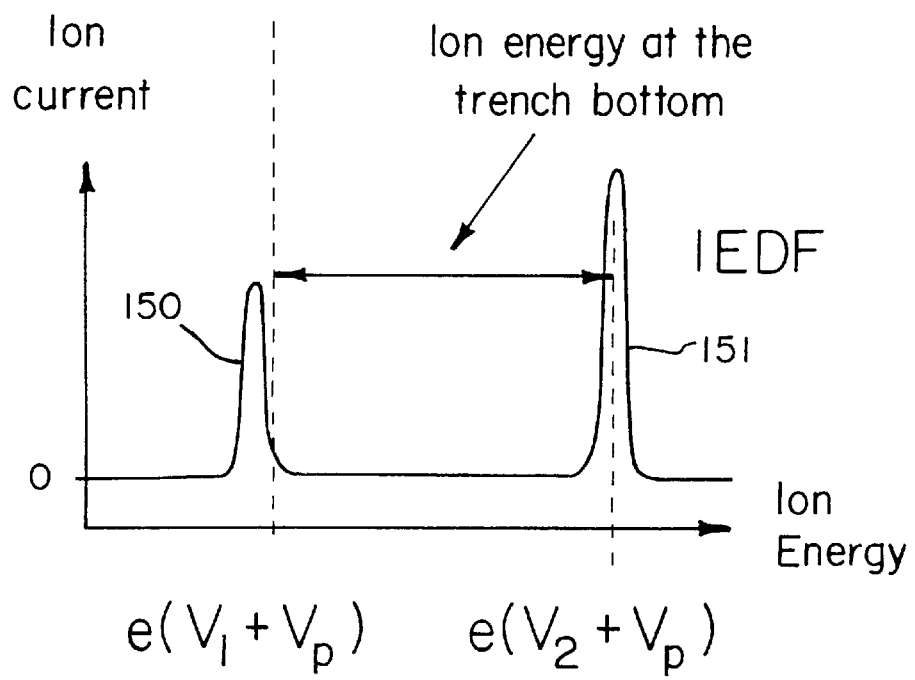
FIG. 20 is an illustrative diagram of the IEDF for the bias voltage waveform as shown in FIG. 19, showing the two separate peaks in ion flux at two separate ion energies.
Figure 21:
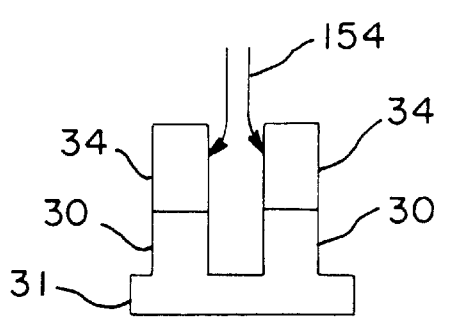
FIG. 21 is an illustrative diagram showing the actions of low energy ions from the low energy ion peak as the ions enter a trench.
Figure 22:
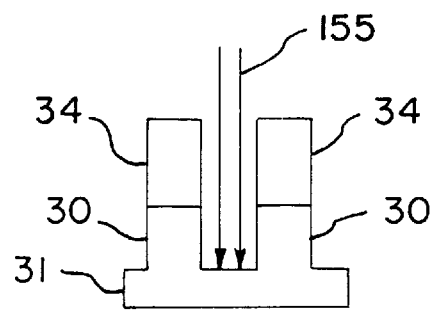
FIG. 22 is an illustrative diagram showing the action of high energy ions from the high energy peak as they enter a trench.

The present invention may also be utilized to tailor the bias voltage waveform to obtain an IEDF with two or more peaks centered at different ion energies and with substantially no ion flux between the peak ranges. An appropriate substrate bias voltage waveform to obtain a double energy peak IEDF is illustrated at 120 in FIG. 17. Each cycle of the waveform 120 includes a first peak voltage 121 which rises to a high level, followed by a constant voltage section 122, followed by a second peak 123, followed by a lower constant voltage section 124. The cycle then repeats. The first constant voltage section 122 is at a potential $V_1$ and the second, lower constant voltage section 124 is at a lower potential $V_2$. The voltage $V_C$ at the output of the capacitor 76 to achieve this waveform at the substrate is illustrated by the waveform 130 of FIG. 18, in which each cycle has a first peak 131 followed by a declining voltage section 132, followed by a second peak 133, followed by a declining voltage ramp section 134, after which the cycle repeats. The waveform of FIG. 18 is for a platform 69 which has an insulator layer between the conductive portion of the platform and the substrate so that the bias power is capacitively coupled to the substrate. Thus, the sections 132 and 134 ramp down rather than being constant at the same potential as the substrate. The output of the power amplifier to achieve such a waveform is illustrated at 140 in FIG. 19, and has a cycle which includes a first peak pulse 141, followed by a declining voltage ramp section 142 of selected time length, followed by a second higher voltage peak pulse 143, followed by a second declining voltage ramp section 144 that extends over a longer period of time than the declining voltage ramp section 142. It is understood that these are exemplary waveforms, and drive waveforms may be used which have one pulse peak 141 per cycle or a large peak and a small peak, as well as more than 2 peaks per cycle. By selecting the magnitudes of the pulse peaks 141 and 143, the length of the sections 142 and 144, and the ramp down in voltage in the sections 143 and 144, as well as the repetition rate of the entire cycle, a double peaked IEDF having selected peak energy ranges can be achieved as illustrated in FIG. 20, which has a first peak 150 centered at a selected ion energy and a second peak 151 centered at a higher ion energy, with substantially zero ion flux at ion energies away from the peaks 150 and 151. As illustrated in FIG. 21, the lower peak 150 provides ions which are of a low energy and which may thus be attracted to the sidewalls of the structures 34 to neutralize the differential charging on the sidewalls. As illustrated in FIG. 22, the higher energy peak 151 provides a flux of ions 155 of a high energy which pass into the trench and which do the etching at the trench bottom without being attracted to the sidewalls. The energy position and the ion population of the two ion energy peaks are adjustable, as discussed above. The lower energy peak may be located at a sufficiently low energy so that the low energy ions are deflected by the trench bottom potential and hit the sidewalls to reduce differential charging. With adequate ion population of the low energy peak, the trench bottom potential is limited and is close to the lower energy peak position. With the freedom then to adjust the location of the high energy peak, the ion energy, etching rate, and etching selectivity at the trench bottom may be well controlled. Due to the low energy of the ions that are deflected, the sidewalls can be readily protected from etching by inhibitor films. Furthermore, because the trench bottom potential is constrained to be at a low range of potentials, the tunneling current, and, therefore, the damage to the thin gate oxide are kept low.

A particular advantage of the present invention is that the bias waveform applied to the blocking capacitor may be controlled to cancel the potential on the substrate from the ion flux without a probe at the substrate. With reference to FIG. 10, the monitoring and control circuit 85 is connected (by the line 87) to receive the voltage $V_C$ on the line 77 at the output side of the capacitor 76. As illustrated in FIGS. 13 and 14, the voltage $V_C$ (the waveform 102 in FIG. 13) is substantially the actual substrate potential (the waveform 108 in FIG. 14) as measured by the probe 81 shown in FIG. 10. The blocking capacitor 76 allows the voltage at its output side on the line 77 to float at the same potential as the substrate (workpiece) 68. Thus, the substrate voltage between pulse peaks can be measured non-intrusively by measuring the capacitor output voltage $V_C$. The monitoring and control circuit 85 thus may compare the voltage in the waveform sections 104 between the pulse peaks 103 (see FIG. 13) with a reference, and provide feedback to the signal generator 72 on the line 90 to adjust the bias voltage waveform of FIG. 11 until the waveform sections 104 reach the desired constant level.

Figure 23:
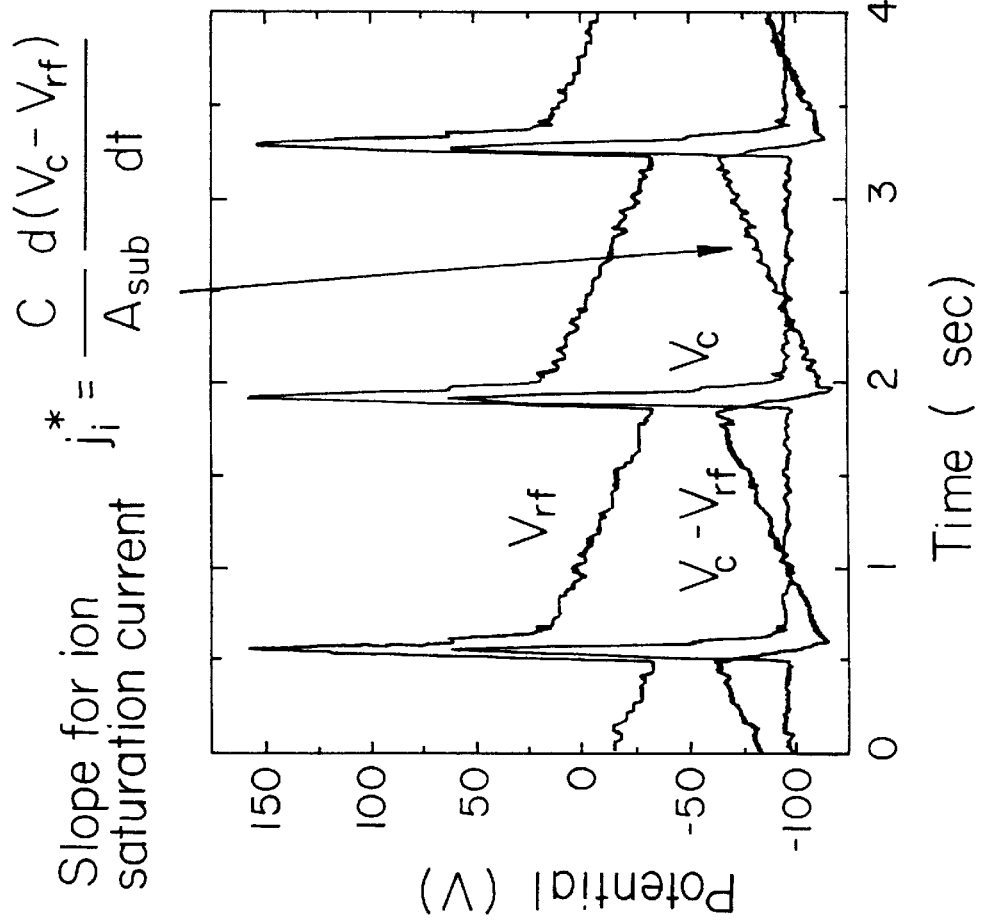
FIG. 23 are illustrative waveforms showing the voltages at the input and output of the DC blocking capacitor and across the DC blocking capacitor for a bias voltage applied to the capacitor as shown in FIG. 12.

With the bias voltage waveform controlled in this manner, the slope of the voltage across the capacitor may be utilized to indirectly measure the ion saturation current, because the slope of the voltage across the capacitor necessary to neutralize the ion current is directly related to the ion current. The slope may be calculated as shown in FIG. 23. The ion flux to the substrate surface represents a constant current to the electrode 69 (current=ion flux*charge/ion; it is assumed that the electron flux is negligible during this period due to the large negative bias) during the period between pulse peaks. Because the blocking capacitor 76 is in series, all of this current flows through the capacitor 76. Because the capacitance C of the capacitor and the voltage V across the capacitor are known, the capacitor current can be determined as I=C dV/dt, allowing the current to be determined from the slope of the capacitor voltage between pulse peaks. The ion flux is then obtained by assuming each ion is singly ionized and carries a positive charge equal and opposite in sign to the electron charge. The ion flux is proportional to the plasma density at the sheath edge, n$_i$, and to the average ion velocity at the sheath edge, which in turn is generally assumed to be equal to the "Bohm velocity,"

$$\sqrt{\frac{KT_e}{M_i}}$$

where T$_e$ is the electron temperature, M$_i$ is ion mass and K is Boltzmann's constant. These two quantities, T$_e$ and n$_i$, are readily controlled through external process variables. The plasma density n$_i$ depends strongly on the amount of power going into plasma generation (e.g., the power to the helicon plasma source 62). The electron temperature T$_e$ is a strong function of the gas pressure in the reactor chamber 61. Thus, a change in the slope of the capacitor voltage is a strong indication that either the power source or gas pressure has drifted, and thus the slope may be used as a feedback parameter to maintain constant operating conditions. Such a feedback technique is non-intrusive, can be done in real time, is not sensitive to the probe conditions, does not introduce contamination into the plasma, and can be readily utilized under industrial manufacturing conditions.

It is understood that the invention is not confined to the embodiments set forth herein as illustrative, but embraces all such modified forms thereof as come within the scope of the following claims.

What is claimed is:

1. A method of plasma ion treatment of a substrate comprising:
   (a) enclosing the substrate in a plasma reactor with a plasma forming gas;
   (b) forming a plasma in the reactor by exciting the plasma forming gas; and
   (c) applying a periodic bias voltage to the substrate through a DC blocking capacitor, each cycle of which has a waveform comprised of a voltage pulse peak followed by a ramp down of voltage from a first level lower than the pulse peak to a second lower level, the period of the bias voltage waveform applied to the DC blocking capacitor and the ramp down of voltage in each cycle selected to compensate for and substantially cancel the effect of ion accumulation on the substrate so as to maintain a substantially constant DC self-bias voltage on the substrate between the voltage pulse peaks, the waveform of each cycle of the bias voltage appearing on the substrate comprising a narrow pulse of voltage during which electrons are attracted from the plasma to the substrate followed by a substantially constant DC bias voltage level resulting from a self-bias of the substrate.

2. The method of claim 1 wherein there is a single voltage pulse peak followed by a ramp down in voltage during each cycle of the bias voltage applied to the DC blocking capacitor such that ion energy distribution function for ions at the surface of the substrate has a single narrow peak centered at a selected ion energy.

3. The method of claim 1 wherein during each cycle of the bias voltage applied to the DC blocking capacitor the waveform comprises two voltage pulse peaks each followed by a ramp down of voltage, the separation in time between the voltage pulse peaks, the heights of the voltage pulse peaks, and the ramp down of voltage between pulse peaks selected to provide a bias voltage at the substrate comprising two voltage peaks during each cycle with a substantially constant DC self-bias voltage following each pulse peak at two different substantially constant DC levels to provide an ion energy distribution function at the substrate that includes two peaks of ion flux centered at two selected ion energies with substantially no ion flux at other ion energies.

4. The method of claim 1 wherein the frequency of the bias voltage waveform applied to the DC blocking capacitor is between about 200 kHz to 500 kHz.

5. The method of claim 1 including monitoring the voltage at the output side of the DC blocking capacitor that is provided to the substrate and adjusting the slope of the ramp down of voltage of the bias voltage waveform applied to the DC blocking capacitor to maintain the voltage at the output of the DC blocking capacitor substantially constant between voltage pulse peaks.

6. The method of claim 5 further including monitoring the voltage across the DC blocking capacitor to estimate ion flux based on the slope of the ramp down of voltage in each cycle of the bias voltage waveform.

7. The method of claim 1 wherein the plasma forming gas in the reactor is excited to form a low pressure high density plasma.

8. The method of claim 1 wherein the substrate includes crystalline silicon with a layer of SiO$_2$ thereon.

9. The method of claim 1 wherein the plasma forming gas includes argon.

10. Plasma treatment apparatus comprising:
   (a) a plasma reactor for enclosing a plasma forming gas and a platform for supporting a substrate to be treated;
   (b) a plasma excitation source coupled to the reactor to excite the plasma forming gas in the reactor;
   (c) a DC blocking capacitor electrically connected to the platform supporting the substrate in the plasma reactor; and
   (d) a bias power supply connected to the DC blocking capacitor to supply bias voltage through the DC blocking capacitor to the platform and to the substrate supported thereon, the bias voltage having a waveform comprised of a voltage pulse peak followed by a ramp down of voltage from a first level lower than the pulse peak to a second lower level, the period of the bias waveform applied to the DC blocking capacitor and the ramp down of voltage in each cycle selected to compensate for and substantially cancel the effect of ion accumulation on the substrate so as to maintain a substantially constant DC self-bias voltage on the substrate between the voltage pulse peaks, whereby the waveform of each cycle of the bias voltage appearing on the substrate comprises a narrow pulse of voltage during which electrons are attracted from the plasma to the substrate followed by a substantially constant DC bias voltage level resulting from a self-bias of the substrate.

11. The apparatus of claim 10 wherein the waveform of the bias voltage from the bias power supply has a single voltage pulse peak followed by a ramp down in voltage during each cycle of the bias voltage applied to the DC blocking capacitor such that ion energy distribution function for ions at the surface of the substrate has a single narrow peak centered at a selected ion energy.

12. The apparatus of claim 10 wherein the waveform of the bias voltage from the bias power supply during each cycle comprises two voltage pulse peaks, each followed by a ramp down of voltage, the separation in time between the voltage pulse peaks, the heights of the voltage pulse peaks, and the ramp down of voltage between pulse peaks selected to provide a bias voltage at the substrate comprising two voltage peaks during each cycle with DC self-bias voltages following each peak at two different substantially constant DC levels to provide an ion energy distribution function at the substrate that includes two peaks of ion flux centered at two selected ion energies with substantially no ion flux at other ion energies.

13. The apparatus of claim 10 wherein the frequency of the bias voltage waveform applied by the bias power supply to the DC blocking capacitor is about 500 kHz.

14. The apparatus of claim 10 including means for monitoring the voltage at the output side of the DC blocking capacitor that is provided to the platform and substrate and adjusting the slope of the ramp down of voltage of the waveform applied by the bias power supply to the DC blocking capacitor to maintain the voltage at the output of the DC blocking capacitor substantially constant between voltage pulse peaks.

15. The apparatus of claim 14 further including means for monitoring the voltage across the DC blocking capacitor to estimate the ion flux based on the slope of the ramp down of voltage in each cycle of the bias voltage waveform.

16. The apparatus of claim 10 wherein the plasma excitation source excites the plasma forming gas in the reactor to form a low pressure high density plasma.

17. The apparatus of claim 10 wherein the plasma forming gas includes argon.

18. The apparatus of claim 10 wherein the bias power supply comprises a signal generator connected to provide a selected output waveform to a power amplifier having a frequency response, wherein the signal generator provides an output waveform tailored to the frequency response of the power amplifier such that the output of the power amplifier comprises the bias voltage waveform applied to the DC blocking capacitor.

* * * * *